United States Patent [19]
Thompson

[11] 3,980,868
[45] Sept. 14, 1976

[54] DIGITAL YACHT RACING TIMING SYSTEM

[76] Inventor: Francis T. Thompson, 3482 Treeline Drive, Murrysville, Pa. 15668

[22] Filed: Apr. 4, 1975

[21] Appl. No.: 565,085

[52] U.S. Cl. .......................... 235/92 T; 235/92 PE; 235/92 EA; 235/92 GA; 235/92 R; 235/150.2; 58/39.5
[51] Int. Cl.² ................. H03K 21/18; H03K 21/36
[58] Field of Search ......... 235/92 GA, 92 T, 92 TF, 235/92 PE, 92 EA, 92 MS, 92 TC, 92 NT, 150.2, 150.24, 150.26, 150.27; 58/39.5

[56] References Cited
UNITED STATES PATENTS

| | | | |
|---|---|---|---|
| 3,284,790 | 11/1966 | Nobles | 58/39.5 X |
| 3,422,253 | 1/1969 | Lundin | 235/92 PE |
| 3,508,034 | 4/1970 | Toyama et al. | 235/92 GA |
| 3,727,213 | 4/1973 | Kurtenbach | 340/323 |
| 3,875,388 | 4/1975 | Luten et al. | 235/150.2 |
| 3,876,867 | 4/1975 | Schull et al. | 235/92 TC |
| 3,877,216 | 4/1975 | Mounce et al. | 235/92 GA |

*Primary Examiner*—Gareth D. Shaw
*Assistant Examiner*—John P. Vandenburg

[57] ABSTRACT

A digital time indication system for displaying the time to the next racing signal of a yacht race. A quartz crystal oscillator provides time reference signals to a frequency divider chain. The divider chain counts down and provides digital signals representing the number of minutes, tens of seconds and seconds to the next starting signal. The divider chain automatically recycles so as to countdown for the next period of preselected length. Switching means are provided to select the desired period from one of several standard yacht racing signal time intervals. Counter preset means are provided to synchronize the counter to a racing signal. Counter decoding is provided to gate an audio frequency signal to an audio amplifier and electromagnetic sound transducer so as to provide an audible beep at a pre-determined rate during the last several seconds preceding the next racing signal. The digital signals from the divider chain are conditioned by signal drivers to control a digital numerical display. The display provides an indication of the time remaining until the next racing signal. Additionally the timing signal derived from the crystal oscillator is also applied to an upcounting chain to provide signals representing the normal time-of-day. Means are provided to select whether the digital display indicates the time-of-day or the time to the next racing signal. Additionally, means are provided to set the time-of-day indication to correspond with a local time standard.

12 Claims, 15 Drawing Figures

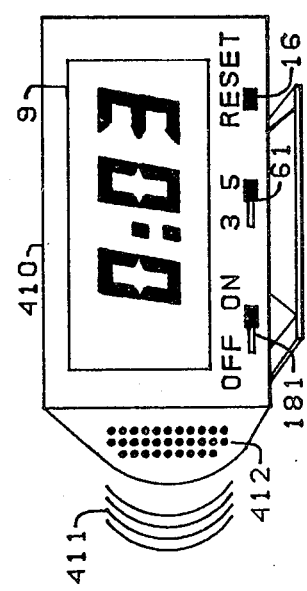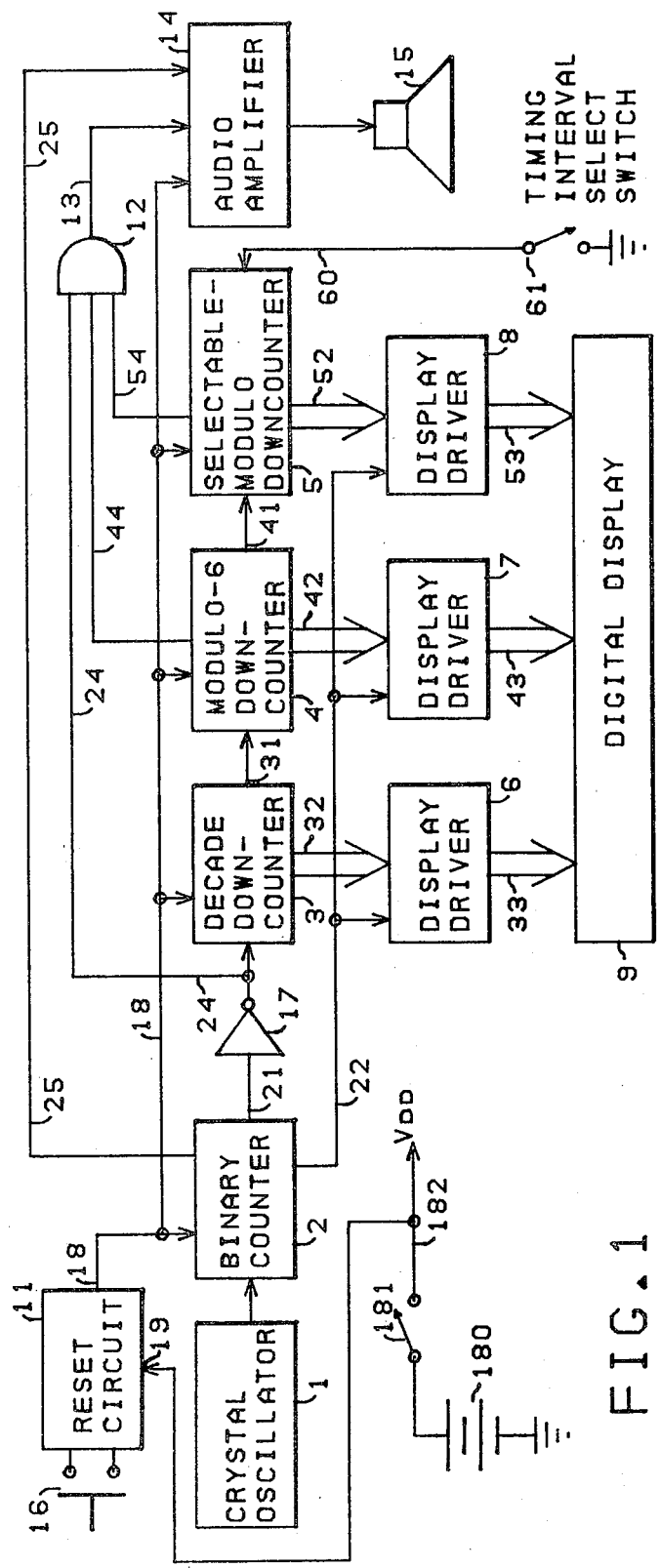

1

DIGITAL YACHT RACING TIMING SYSTEM

BACKGROUND OF THE INVENTION

The invention pertains to yacht racing timers used by participants in yacht racing.

Getting a good start in a yacht race, that is crossing the starting line with a good velocity immediately after the starting signal, is very important. Accordingly, means are provided to permit the participants to anticipate the moment at which the start will occur. Typically, a racing signal is given at precisely 10 minutes prior to the start of the race. This signal is usually an audible horn or cannon firing accompanied by raising of a white shape. This shape is lowered 30 seconds prior to the second racing signal which occurs at precisely 5 minutes prior to the start of the race. This second racing signal consists of an audible horn or cannon firing accompanied by raising of a blue shape. The blue shape is lowered 30 seconds prior to the starting signal. The next racing signal consists of an audible horn or cannon firing accompanied by raising of a red shape. In multiple class races, subsequent classes may start at 5 minute or 10 minute intervals following the first start described above.

Participants generally use special mechanical stop watches that indicate the time remaining to the start or to the next racing signal. These watches are reset, then started at one of the racing signals in order to synchronize them with the sequence of racing signals. These watches are designed for 5 minute intervals between racing signals. Problems with these watches include lack of accuracy, lack of easy readability and lack of flexibility. Flexibility is needed because races are often started with 3 minute intervals between racing signals rather than 5 minute intervals described above. Furthermore, the last 10 to 20 seconds prior to the start of the race are extremely hectic, with the skipper having to avoid fouling or touching other closely maneuvering boats, avoiding being over the starting line prematurely, and trying to maneuver into a good position. Minimal time is available for reading a timer and yet knowing the time remaining to the start is very important. Thus a means of counting down the seconds to the start without watching the timer would be very useful.

SUMMARY OF THE INVENTION

This invention discloses a digital timing system for providing a highly accurate, easily readable digital display of yacht race timing information to an individual. This system provides a digital count-down during a pre-determined time period corresponding to the interval between racing signals or a multiple of this interval. The system automatically recycles for additional time periods of equal length thereby providing maximum utility for restarts or multiple class racing. Means are provided for initiating the countdown at a racing signal. Additonally, means are provided for selecting one of a plurality of predetermined time periods so that the timing system is adaptable to other intervals between racing signals, such as 3 minute intervals, as well as the usual 5 minute intervals. Additionally, means are provided for producing an audible countdown during a final portion of the predetermined time period so that the skipper may concentrate on the competition during the last several seconds prior to the start without having to look at the visual display. Additionally, this invention provides a flexible timing system which can be used to display the time-of-day as well as the time remaining to a starting signal thereby performing the dual functions of an accurate time piece as well as a yacht racing timer. The digital timing system is designed for low power consumption and can be housed in a wristwatch type case as well as a time type case thereby providing maximum convenience to the individual user.

BRIEF DESCRIPTION OF THE DRAWINGS

For a better understanding of the invention, reference may be had to the preferred embodiment, exemplary of the invention, shown in the accompanying drawings, in which:

FIG. 1 is a system block diagram exemplary of the operation of this invention;

FIG. 2 is a representation of a physical embodiment of the digital timing system of FIG. 1;

FIG. 14 is a representation of a wristwatch-type housing suitable for use with the system of FIG. 1 or FIG. 9;

DESCRIPTION OF THE PREFERRED EMBODIMENT

The digital yacht racing timer described herein is designed to be used on a yacht or a sailboat as a portable unit powered by a small battery. The preferred embodiment is described using RCA complimentary metal-oxide-semiconductor integrated circuits, commonly known as COS/MOS as described in RCA 1975 Databook SSD-203C. COS/MOS circuits are desirable because of their low power consumption and ability to operate over a wide range of battery voltage. All COS/MOS circuits are described with their $V_{SS}$ terminals connected to ground which is the logic ZERO level. The ONE logic level corresponds to the positive supply voltage which is connected to the $V_{DD}$ terminal of the integrated circuits.

The crystal oscillator 1 of FIG. 1 provides an accurate time base reference for the timer. A suitable crystal oscillator circuit is described in application note ICAN-6086 of the above referenced RCA databook.

Figure 4:
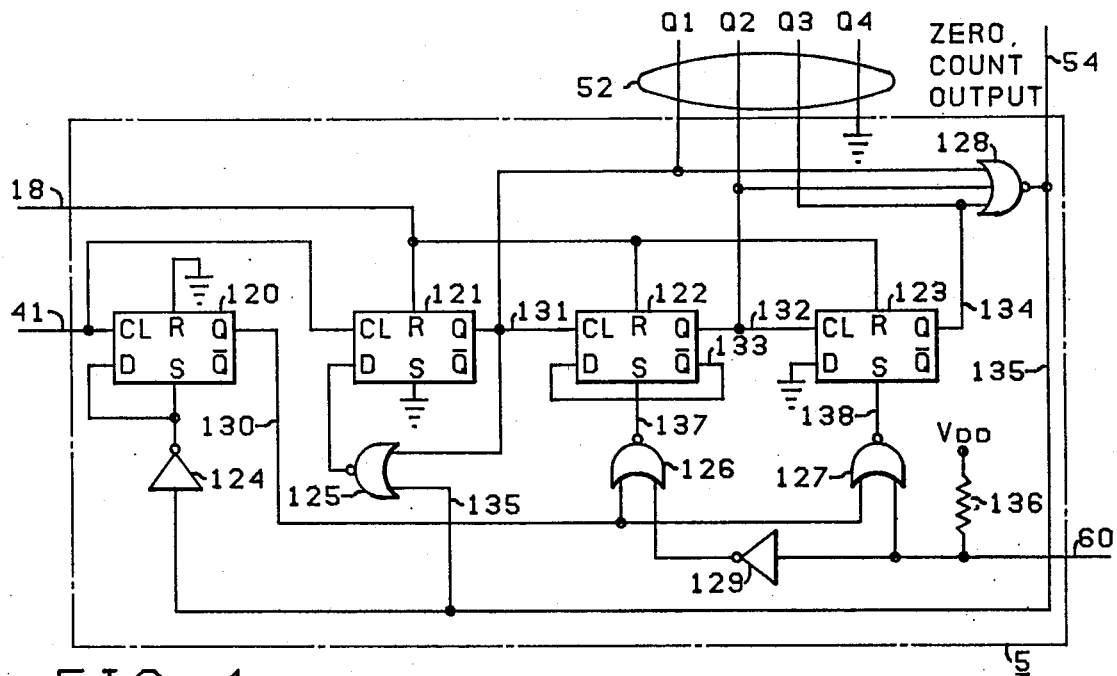
FIG. 4 is a schematic diagram of an exemplary selectable-modulo down-counter employed in FIGS. 1 and 9.
Figure 5:
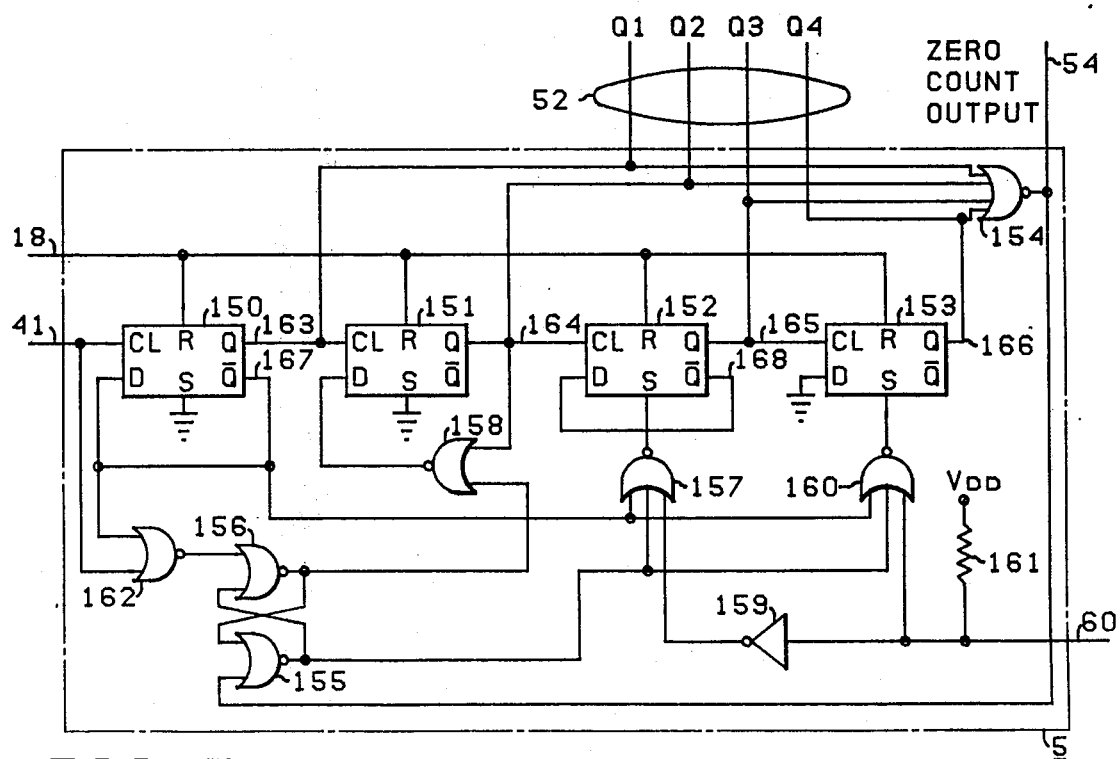
FIG. 5 is a schematic diagram of an alternate selectable-modulo down-counter which may be employed in the embodiments of FIGS. 1 and 9.

The output of the crystal oscillator 1 is connected to the pulse input terminal of binary counter 2. The crystal oscillator frequency and binary counter are selected so that the pulse repetition rate of the output signal from the binary counter 2 is one pulse per second. If a crystal oscillator frequency of 16384 Hz is selected, a 14-stage binary counter such as the RCA CD4020AE integrated circuit will provide the desired output frequency of 1 Hz from its Q14 output terminal. Signal 21 is applied to signal inverter 17 which produces signal 24 which is connected to the clock input of decade down-counter 3 and to AND gate 12. Down-counter 3 may be embodied using a CD4029AE integrated circuit by connecting the carry-in input, the binary/decade input, the up/down input and the four jam inputs to ground potential. The present enable input is connected to reset line 18. The carry-out signal 31 from counter 3 has a repetition rate of 0.1 Hz. Signal 31 is applied to the input of modulo-6 down-counter 4. A suitable modulo-6 down-counter is described below in reference to FIG. 3. The modulo-6 down-counter acts as a divide-by-6 stage and produces an output signal 41 having a repetition rate of one pulse per minute. Signal 41 is applied to a selectable-modulo downcounter 5, the repetition period of which can be preselected by the state of a period-selecting input signal 60. Two alternate preferred embodiments of selectable-modulo down-counters are illustrated in FIGS. 4 and 5.

The output 32 of counter 3 represents the state of the counter and consists of signals Q1, Q2, Q3, and Q4 of the decade counter which represent the binary-coded-decimal signals $2^0$, $2^1$, $2^2$ and $2^3$ respectively. These signals are connected to the corresponding $2^0$, $2^1$, $2^2$, and $2^3$ binary-coded-decimal inputs of display driver 6 which may be embodied using a CD4055AE integrated circuit. A signal 22 form binary counter 2 is connected to the display frequency input of display driver 6. An output from the Q9 terminal of a CD4020AE integrated circuit used as binary counter 2 will provide a 32 Hz signal that is well suited for display input signal 22.

Figure 10:
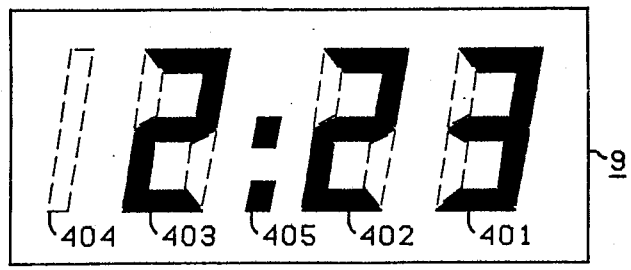
FIG. 10 is a representation of a seven segment digital display as used herein.

The output 33 from display driver 6 in a preferred embodiment consists of the seven-segment signals and the display frequency output signal for driving the seven-segment electrodes and the common electrode respectively, of a liquid crystal numeral of digital display 9 which is illustrated in FIG. 10. The dashed lines of FIG. 10 are illustrative of the position of the segments which are indicated as not presently energized. The detailed connections and waveforms for driving the liquid crystal numeral are illustrated in the CD4055AE data file in the above referenced SSD-203C RCA databook. The numeral 401 driven by output 33 is representative of the number of units-seconds until the next racing signal. The colon 405 can be driven by the output of a single inverter stage whose input is driven by display frequency signal 22.

Output 42 from counter 4 consists of signals Q1, Q2 and Q3 representing the binary-coded-decimal outputs $2^0$, $2^1$ and $2^2$ respectively. These signals are connected to the corresponding $2^0$, $2^1$ and $2^2$ binary-coded decimal inputs of display driver 7 which may be of the same type as used for display driver 6. A signal level representing a ZERO state is connected to the $2^3$ binary-coded-decimal input of display driver 7. Signal 22 is connected to the display frequency input of display driver 7. The output signals from display driver 7 drive the numeral 402 of digital display 9 representing the number of tens-of-seconds until the next racing signal.

Output 52 from counter 5 consists of signals Q1, Q2, Q3 and Q4 representing the binary-coded-decimal outputs $2^0$, $2^1$, $2^2$ and $2^3$ respectively. These signals are connected to the corresponding $2^0$, $2^1$, $2^2$, and $2^3$ binary-coded decimal inputs of display driver 8 which may be of the same type as used for display driver 6. Signal 22 is connected to the display frequency input of display driver 8. The output signals 53 from display driver 8 drive the numeral 403 of digital display 9 representing the number of minutes until the next racing signal.

Figure 7:
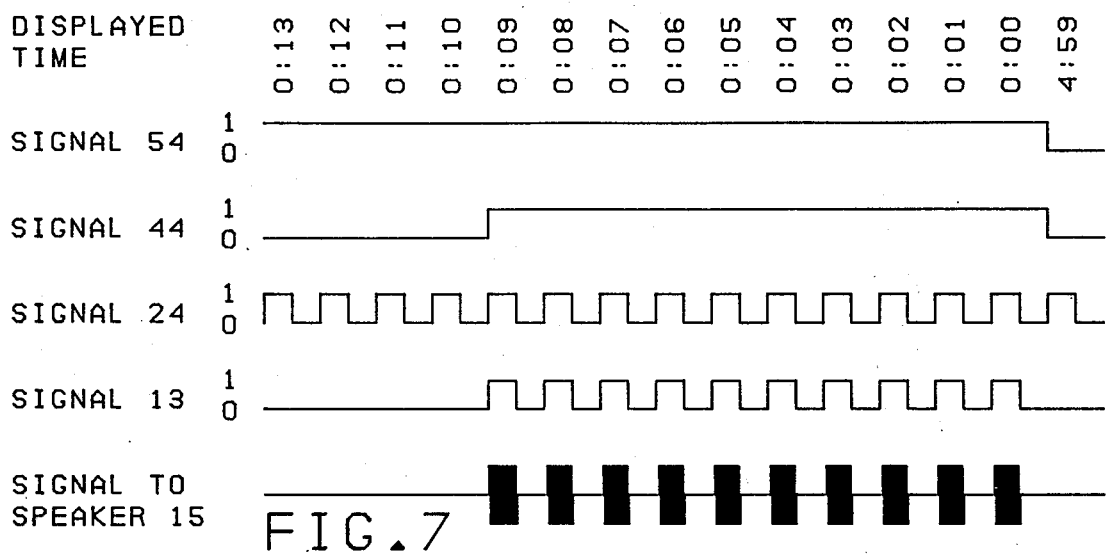
FIG. 7 is a timing diagram illustrating the waveforms produced in the embodiments of FIGS. 1 and 9.

Signal 44 from counter 4 indicates when counter 4 has a zero count. Signal 44 is in the ONE state only when Q1, Q2 and Q3 of counter 4 are all equal to ZERO. Similarly, signal 54 from counter 5 is in the ONE state only when counter 5 has a zero count. Since counters 4 and 5 represent the number of tens-of-seconds and minutes until the next racing signal, signals 44 and 54 are both in the ONE state only during the last 10 seconds before the racing signal. The output 24 of inverter 17 has a frequency of 1 Hz and is a ONE during the first half of each one-second counting period. Signals 24, 44 and 54 are connected to the inputs of AND gate 12. The output 13 of AND gate 12 is a ONE during the first half of the counts representing 9, 8, 7, 6, 5, 4, 3, 2, 1 and 0 seconds prior to the next racing signal as illustrated in FIG. 7. Signal 13 is connected to audio amplifier 14 along with reset signal 18 and an audio frequency signal 25 having a frequency such as 1024 Hz obtained from the Q4 output of binary counter 2. Whenever signal 13 is a ONE and signal 18 is a ZERO, audio amplifier 14 energizes a vibratory output means such as permanent magnet speaker 15. Speaker 15 produces an audio beep during the first half of counts 9, 8, 7, 6, 5, 4, 3, 2, 1, 0. This precisely timed audio countdown alerts the skipper of the impending start and allows him to mentally count down while watching the starting line and his competition.

Battery 180 is connected to the circuit by means of on-off switch 181 and conductor 182 which provides a positive $V_{DD}$ supply voltage to all stages and to input terminal 19 of reset circuit 11. When the circuit is first energized or whenever reset pushbutton 16 is depressed, reset circuit 11 produces a ONE signal on reset line 18 which resets counters 2, 3, 4 and 5 to a zero count. Down-counting resumes from the zero count as soon as the reset line 18 returns to the ZERO state. Speaker 15 will produce a single beep following resetting the counters to zero count thereby providing an audio acknowledgment of the reset condition. If a binary counter 2 is used which changes count on negative input signal transitions while decade down-counter 3 changes count on positive transitions, an inverter 17 is needed to ensure that counter 3 changes count one second after the reset line returns to its normal ZERO state rather than one-half second after the reset line returns to its normal state. The reset button 16 and reset circuit 11 permit the skipper to synchronize the timer at the first racing signal by either closing switch 181 or by pushing reset button 16 if the timer is already energized.

Switch 61 when closed connects signal line 60 to ground and thereby applies a logic ZERO to line 60. When switch 61 is open circuited, a resistor in down-counter 5 connects line 60 to a positive voltage source $+V_{DD}$ thereby providing a logical ONE. The position of switch 61 determines the timing interval by determining the counting cycle of minutes down-counter 5.

Referring now to FIG. 2, an illustrative embodiment of the digital timing system is shown in a suitable housing 410. The unit is synchronized to a racing signal by either turning it on by means of switch 181, or if it is already turned on by depressing reset button 16. Switch 61 was previously set to select an appropriate predetermined time interval compatible with the interval between racing signals. Display 9 provides a visual indication of the number of minutes and seconds remaining until the end of the predetermined time interval. A sound signal 411 which provides an audible indication of the final portion of the predetermined time interval is illustrated as emanating from ports 412 of housing 410. The use of a watertight plastic housing contained within housing 412 can be advantageous for keeping water from reaching the electronic components. The electronic components are mounted within this plastic housing with the possible exception of the battery 180 and loudspeaker 15. The water-tight seal can be better maintained by using magnetically actuated switches for embodying switches 16, 61 and 181. The switch capsules of magnetic reed switches such as the Hamlin MLC-2-186 switch are mounted within the plastic housing while permanent magnet actuators, contained within housing 410, are outside the plastic housing and are connected to the switch knobs shown protruding from case 410.

Figure 3:
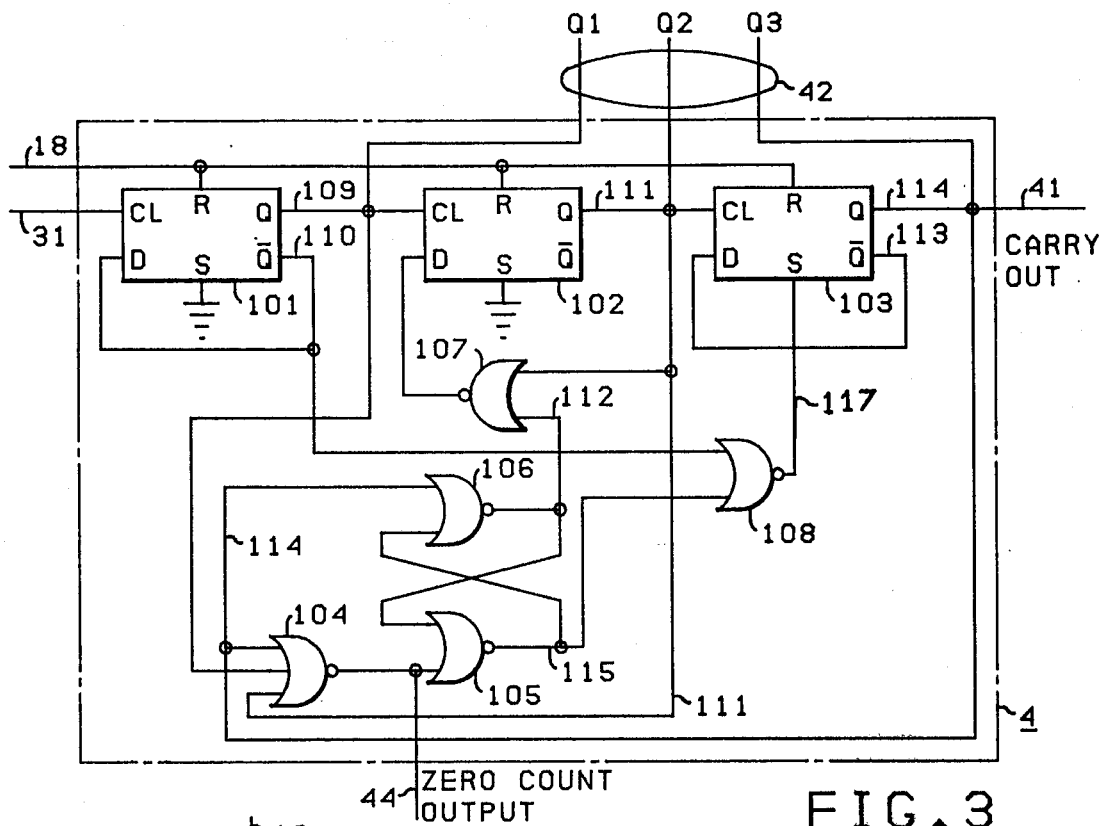
FIG. 3 is a schematic diagram of an exemplary modulo-6 downcounter employed in FIGS. 1 and 9.

Referring now to FIG. 3, a preferred embodiment of modulo-6 down-counter 4 is illustrated. Input signal 31 is applied to the clock input of a D-type flip-flop 101 such as the CD4013AE integrated circuit. This type of integrated circuit is suitable for all D-type flip-flops described herein. The $\overline{Q}$ output 110 is fed back to the D input which causes flip-flop 101 to change state on each positive transition of input signal 31. Therefore, flip-flop 101 acts as a binary divider and its Q output signal 109 has a frequency one-half that of input signal 131. Signal 109 provides the Q1 or $2^0$ output portion of signals 42. Signal 109 is also connected to the clock input of D flip-flop 102. The Q output 111 is inverted by NOR gate 107 as long as signal 112 remains in a ZERO state. When signal 112 is ZERO the output of NOR gate 107 is the same as the Q output of flip-flop 102. The output of NOR gate 107 is connected to the D input of flip-flop 102. Flip-flop 102 will change state on each positive transition of signal 109 as long as signal 112 remains a ZERO. Output signal 111 provides the Q2 or $2^1$ output portion of signals 42. Signal 111 is also applied to the clock input of flip-flop 103. The Q output 113 is fed back to the D input and therefore flip-flop 103 will change state on each positive transition of signal 111. The Q output 114 provides the Q3 or $2^2$ output portion of signals 42 and the carry-out signal 41. If signal 112 always remained a ZERO, the counter as described above would be a binary down-counter and count 0, 7, 6, 5, 4, 3, 2, 1, 0, 7, 6, ect. The desired modulo-6 down-counter should count 0, 5, 4, 3, 2, 1, 0, 5, 4, etc. This desired action occurs as described below. When the decimal count 0 is reached signals 109, 111 and 114, which are connected to the input of NOR gate 104, are all in the ZERO state. Output signal 44 of NOR gate 104 becomes a ONE under this condition. Signal 44 is applied to the flip-flop consisting of NOR gates 105 and 106. When signal 44 is a ONE it sets the flip-flop to the state where output 112 is a ONE and output 115 is a ZERO. The ONE output signal 112 causes the output of NOR gate 107 to become and remain a ZERO. When the next positive transition of signal 31 causes flip-flop 101 to change state and signal 109 becomes a ONE, the positive transition of signal 109 will not cause flip-flop 102 to change state since the output of gate 107 has a ZERO value and is applied to the D input of flip-flop 102. Thus signal 111 remains ZERO. When signal 109 changes state to a ONE, signal 110 becomes a ZERO. Signal 110 and signal 115 applied to the inputs of NOR gate 108 are now both ZERO and therefore the output signal 117 of gate 108 becomes a ONE. This signal is applied to the set input of flip-flop 103 which causes it to change state so that output 114 becomes a ONE. This signal 114 is applied to the input of NOR gates 104 and 106 with the result that signal 44 returns to the ZERO state and the flip-flop comprised of gates 105 and 106 is reset to the original state with signal 112 being a ZERO and signal 115 being a ONE. The counter therefore has changed from the state where signals Q1, Q2 and Q3 were ZERO representing a decimal 0 count to a state where Q1 is ONE, Q2 remains ZERO and Q3 is ONE which represents the decimal count 5. Signals 112 and 117 are now ZERO and therefore the counter will act as a normal down-counter until the decimal count of 0 is reached once more.

Reset input line 18 of counter 4 is connected to the reset inputs of flip-flops 101, 102 and 103. Application of a ONE input signal to line 18 will reset the counter to decimal count 0.

Referring now to FIG. 4, a preferred embodiment of a selectable-modulo down-counter is illustrated. When timing interval select switch 61 is closed the counter will function as a modulo-5 counter, while with the switch open it will function as a modulo-3 counter. Consider first operation with the switch closed. Closing the switch 61 applies a logical ZERO signal to line 60 and to the inputs of NOR gate 127 and inverter 129. The ZERO signal on line 60 is inverted by inverter 129. The output of inverter 129 applies a ONE signal to NOR gate 126 forcing output signal 137 to ZERO thereby preventing gate 126 from responding to input signal 130.

The output signals 52 represent the state of the down-counter D-type flip-flops 121, 122 and 123. The Q outputs 131, 132 and 134 represent respectively the Q1, Q2 and Q3 portions of signals 52 which represents respectively the $2^0$, $2^1$ and $2^2$ bits of the counter. The Q4 portion of signals 52 is connected to ground to provide a logical ZERO representing the permanent state of the $2^3$ count. For counter states other than decimal zero at least one of the signals 131, 132, 134 which are connected to the input of NOR gate 128 will have a ONE value and therefore the output 135 will have a ZERO value. Signal 135 is inverted by inverter 124. The output of inverter 124 applies a ONE signal to the set and D inputs of flip-flop 120 keeping it in the SET state with output signal 130 remaining a ONE as long as signal 135 remains a ZERO. Signal 130 is applied to NOR gate 127 and therefore the output 138 remains a ZERO as long as signal 135 remains a ZERO. The input signal 41 is applied to the clock inputs of flip-flops 120 and 121. During the time that signal 135 remains a ZERO, NOR gate 125 will simply invert the Q output signal 131 of flip-flop 121. Since the output of NOR gate 125 is applied to its D input, flip-flop 121 will change state for each positive transition of input signal 41. The output 131 is connected to the clock input of flip-flop 122. Positive output transitions of signal 131 will cause flip-flop 122 to change state because Q output signal 133 is connected to the D input of flip-flop 122. The Q output signal 132 is connected to the clock input of flip-flop 123. The D input of flip-flop 123 is connected permanently to ground. The first positive transition of output signal 132 will cause flip-flop 123 to assume a ZERO state with Q output signal 134 becoming a ZERO. This transition occurs between counts 4 and 3 of the modulo-5 down-counter 5. The down-counter 5 as described above with signal 135 equal to ZERO and signal 60 equal to ZERO will count from 4 to 3 to 2 to 1 to 0. When the 0 decimal count is reached the signals 131, 132 and 134 applied to NOR gate 128 all become ZERO and signal 135 becomes a ONE. Signal 135 is connected to output lead 54. A ONE signal on lead 54 indicates the counter 5 is in the decimal count 0 state. Signal 135 being a ONE results in the output of inverter 124 becoming a ZERO and the output of NOR gate 125 becoming a ZERO. The output signal 131 of flip-flop 121 will remain ZERO in spite of the next positive input transition of input signal 41 since the ZERO output of gate 125 is applied to the D input of flip-flop 121. Since signal 131 remains ZERO, no change occurs on the clock input of flip-flop 122 and output signal 132 also remains ZERO. This next positive transition of input signal 41 will cause the output signal 130 of flip-flop 120 to become a ZERO. Signal 130 is applied to NOR gates 126 and 127. With signal 60 equal to a ZERO as described above, signal 137 remains ZERO but NOR gate 127 will invert the value of signal 130 applied to its input. Under this condition, when signal 130 becomes a ZERO, signal 138 becomes a ONE. This signal 138 is applied to the set input of flip-flop 123 setting the Q output 134 to a ONE state. When signal 134 becomes a ONE it causes signal 135 to return to the ZERO state. Thus the next positive transition of input signal 41 following the decimal count 0 of down-counter 5 has resulted in signals 131 and 132 remaining ZERO and signal 134 becoming a ONE. This corresponds to the decimal count of 4 and therefore the desired modulo-5 count of 4, 3, 2, 1, 0, 4, 3, 2, 1, 0, 4, etc., is obtained.

When switch 61 is opened, resistor 136 connected to the positive logic potential $V_{DD}$ causes signal 60 to become a logic ONE. This signal is applied to NOR gate 127 forcing signal 138 to remain ZERO. Since the D input of flip-flop 123 is connected to ground, once signal 134 becomes a ZERO it will remain ZERO as long as signal 60 remains a ONE. When the 0 decimal count state of down-counter 5 is reached signal 135 becomes a ONE as described above thereby causing the output from NOR gate 125 to apply a ZERO to the D input of flip-flop 121. The ONE signal 135 is inverted by inverter 124 thereby applying a ZERO to the set and D inputs of flip-flop 120. On the next positive transition of input 41 flip-flop 120 changes state and output 130 becomes a ZERO. The positive transition of input 41 does not change signal 131 from its ZERO state, since the D input of flip-flop 121 is ZERO. When signal 130 becomes a ZERO with signal 60 being a ONE, the output 137 of NOR gate 126 becomes a ONE. Signal 137 is applied to the set input of flip-flop 122 causing Q output 132 to become a ONE. This transition of signal 132 to a ONE does not change the state of flip-flop 123 because the D input of flip-flop 123 is a ZERO. The first positive transition of input signal 41 following the 0 decimal count state of down-counter 5 has resulted in signals 131 and 134 remaining ZERO and signal 132 becoming a ONE. This corresponds to a counter transition from decimal state 0 to decimal state 2. Once signal 132 becomes a ONE, it causes the output 135 of gate 128 to become ZERO which returns the counter to a normal binary down-counter as described above. Hence with signal 60 being a ONE the desired modulo-3 downcounting action is obtained and the counter 5 counts 0, 2, 1, 0, 2, 1, 0, 2, etc. Applying a ONE signal to reset input 18 resets flip-flops 121, 122 and 123 to a ZERO state to produce a decimal count 0. When reset input 18 returns to a ZERO the down-counter is ready to count down to the next desired count.

A second example of a selectable-modulo counter is illustrated in FIG. 5. When switch 61 is closed a ZERO signal is applied on lead 60 which will cause the counter to act as a decimal down-counter. When switch 61 is open, resistor 161 will apply a logic ONE signal to line 60 and the counter will act as a modulo-6 counter. In this latter case, the ONE signal on line 60 produces a ZERO output from NOR gate 160 and flip-flop 153 will remain in the ZERO state with signal 166 a ZERO. The output of inverter 159 will be a ZERO which enables NOR gate 157 to follow its other inputs. The counter acts as a modulo-6 counter and functions in the same manner as described for counter 4 of FIG. 3. Flip-flops 150, 151 and 152 function in the same manner as flip-flops 101, 102 and 103 of FIG. 3 since gates 154, 155, 156, 157 and 158 perform the same functions as gates 104, 105, 106, 108 and 107 respectively. NOR gate 162 serves to reset flip-flop 155–156 on the next negative transition of input signal 41 following the positive transition that results in the state of down-counter 5 changing from a 0 decimal count to a 5 decimal count. When switch 61 is closed, the resulting ZERO signal on line 60 is inverted by inverter 159. The output of inverter 159 is a ONE which causes the output of NOR gate 157 to remain a ZERO. NOR gate 160 is therefore enabled rather than NOR gate 157 and therefore the SET pulse occurring as a result of the positive transition of input pulse 41 when the counter 5 has just previously been in the 0 decimal count state sets flip-flop 153 to a ONE state with signal 166 being a ONE. Therefore the transition is from decimal count 0 to decimal count 9. Therefore the counter acts as a modulo-10 or decimal counter. This type of counter is useful in sailboat racing to count down from the time of the racing signal accompanying the raising of the white shape to the starting signal rather than from one racing signal to the next racing signal.

A power source for the entire circuit is shown embodied as a battery 180 in FIG. 1. Switch 181 provides a means for energizing and de-energizing the circuit. Conductor 182 carries the positive battery potential to all $V_{DD}$ terminals of the integrated circuits and to other points designated by $V_{DD}$, and to input 19 of reset circuit 11. Prior to closing switch 181 the circuit is de-energized and conductor 182 has a potential corresponding to logic ZERO.

Figure 6:
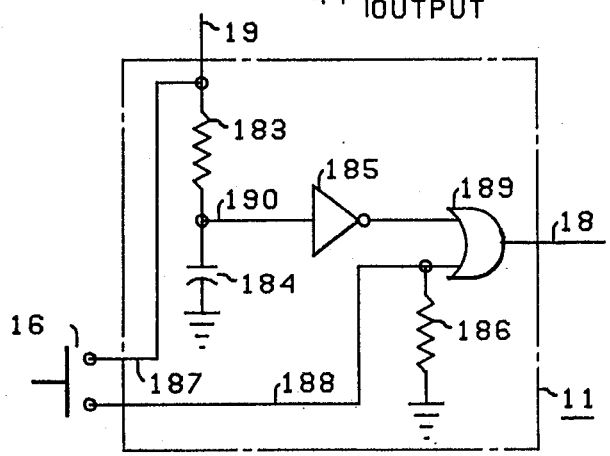
FIG. 6 is a schematic diagram of the reset circuit employed in FIGS. 1 and 9.

Referring now to FIG. 6, capacitor 184 of reset circuit 11 has discharged through resistor 183 and applies a ZERO potential to inverter 185 by means of conductor 190. When switch 181 is closed, conductor 182 assumes the positive battery potential and energizes the circuit elements. Since capacitor 184 can only charge slowly through resistor 183 it continues to apply a logic ZERO to inverter 185 for a fraction of a second following the closing of switch 181. Therefore, the output of inverter 185 is a logic ONE during this fraction of a second. This ONE signal is applied to OR gate 189. Therefore OR gate 189 applies a ONE signal to reset line 18 for a fraction of a second following the closing of switch 181. This resets the counters when the circuit is first energized.

After switch 181 has been closed for a short period of time, resistor 183 causes capacitor 184 to charge to a voltage level corresponding to a logic ONE. This signal is inverted by inverter 185 and applies a ZERO signal to OR gate 189.

A reset signal is also obtained by pressing reset pushbutton 16. This connects the positive battery voltage, which corresponds to a logic ONE, by means of conductors 187 and 188 to OR gate 189. The output of OR gate 189 provides a ONE signal on reset line 18 to reset all counter stages. When pushbutton switch 16 is open-circuited, resistor 186 maintains a logic ZERO on signal line 188. With pushbutton 16 open-circuited and capacitor 184 charged to a ONE signal, both inputs of OR gate 189 are ZERO and the reset line 18 remains in its normal ZERO condition.

Figure 8:
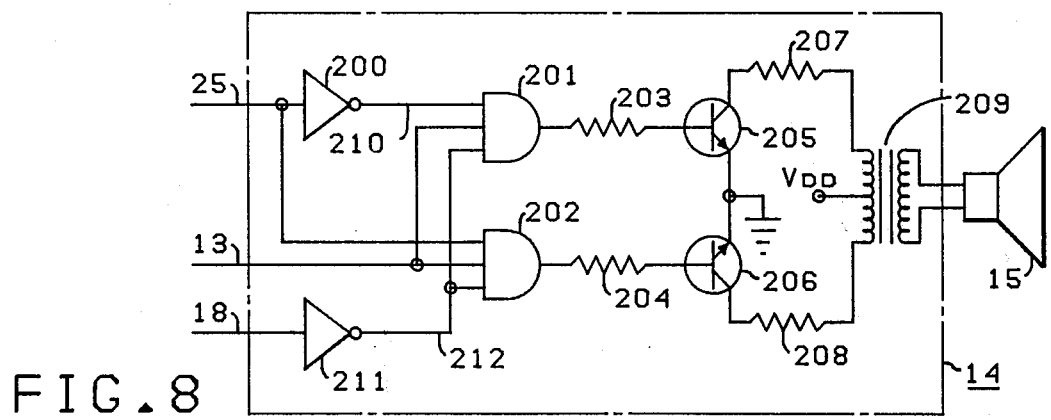
FIG. 8 is a schematic diagram of the audio amplifier circuit employed in FIGS. 1 and 9.

As described previously with respect to FIG. 1, an audio signal 25 of suitable frequency for producing an audible tone and a gating signal 13 are applied to audio amplifier 14. Signal 13 is a ONE only during the first portion of the counts repesenting 9, 8, 7, 6, 5, 4, 3, 2, 1 and 0 seconds prior to the next racing signal as illustrated in FIG. 7. Referring now to FIG. 8, audio signal 25 is inverted by inverter 200 to produce signal 210. Reset signal 18 is applied to inverter 211 to produce signal 212 which is the complement of signal 18. Signal 212 prevents the audio output from being energized while the counters are held reset. Signals 210 and 212 are applied to AND gate 201 along with gating signal 13. The output of gate 201 is applied through resistor 203 to the base of transistor 205. Transistor 205 will conduct when signals 13, 210 and 212 all have values of ONE. Similarly, transistor 206 will conduct when signals 13, 25 and 212 have values of ONE and therefore produce a ONE output from AND gate 202 which drives the base of transistor 206 by means of resistor 204. Since audio frequency signals 25 and 210 are complementary signals, transistors 205 and 206 conduct on alternate half cycles of signal 25 whenever signals 13 and 212 are both in the ONE state. This causes current from primary of audio output transformer 209 to flow alternately through current limiting resistors 207 and 208. This results in a push-pull drive which produces an alternating voltage across the secondary of transformer 209 which energizes speaker 15. The signal applied to the speaker is illustrated in FIG. 7. When either signal 212 or signal 13 is a ZERO, the outputs of AND gates 201 and 202 are ZERO and transistors 205 and 206 are cut off. It will be obvious to those skilled in the art that other decoding methods can be used to derive signal 13, so that the audio beep count-down could occur for a selected number of seconds other than 10 seconds preceding the next racing signal. Beeping rates other than once per second are also possible. The selection of one beep per second for the last 10 seconds was selected for usefulness and ease of implementation. Other types of electromagnetic transducers can be used to generate a sound output or other forms of vibratory output.

Figure 9:
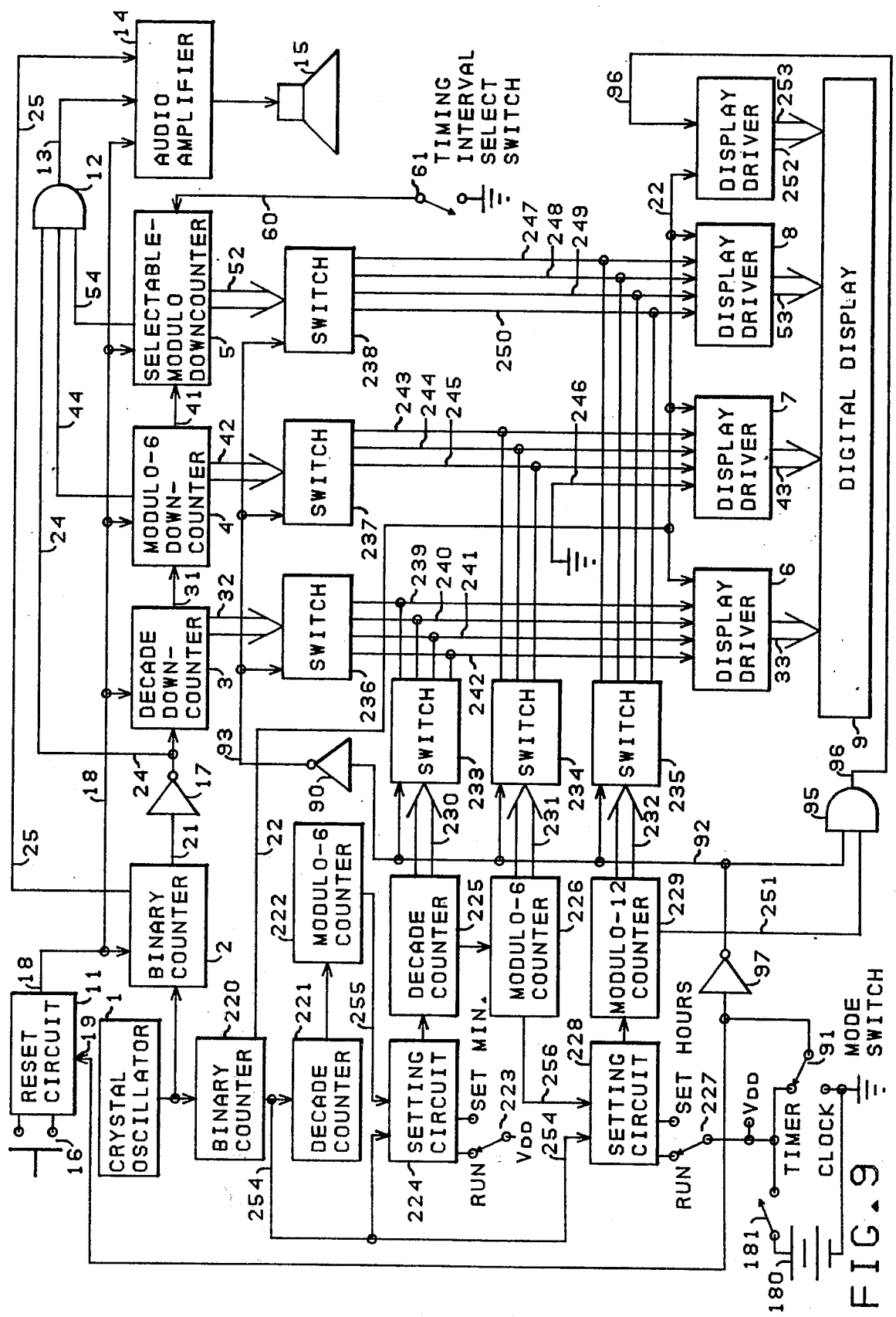
FIG. 9 is a system block diagram of a second embodiment of this invention providing a numerical display of either the time-of-day or a time related to a yacht racing signal.

Referring now to FIG. 9, a preferred embodiment of a combination racing timer and clock circuit that can display either the time remaining to a racing signal or the time-of-day. When mode switch 91 is in the timer position, components 1 through 17 function as described previously with reference to FIG. 1 to provide a racing time information display. Timing interval switch 61 also functions as described relative to FIG. 1. When mode switch 91 is in the clock mode the unit functions as a digital clock.

Figure 12:
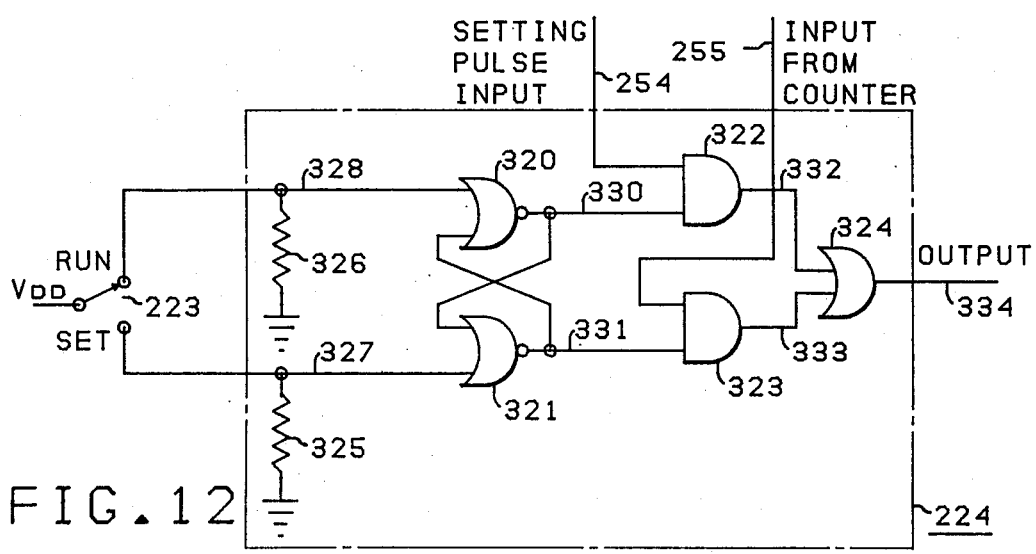
FIG. 12 is a schematic diagram of the setting circuit employed in FIG. 9.
Figure 11:
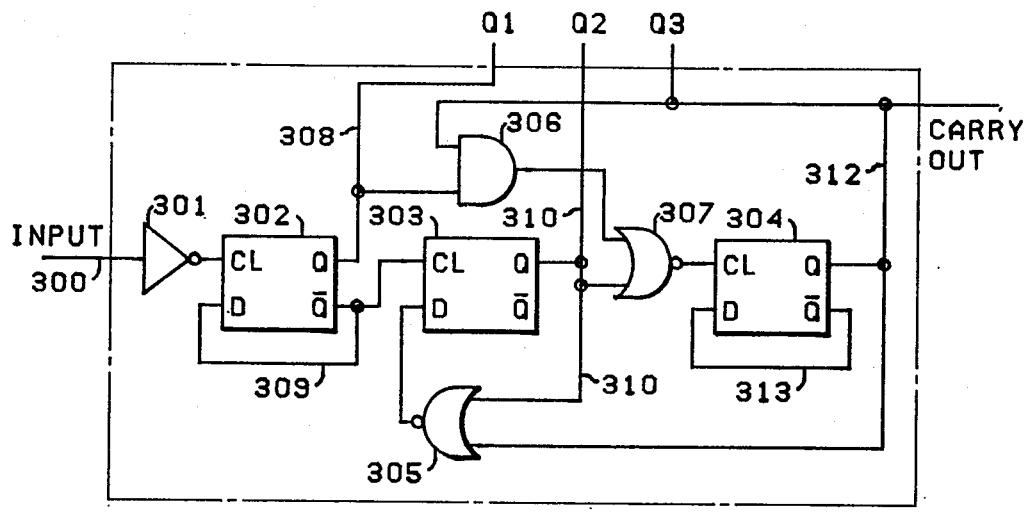
FIG. 11 is a schematic diagram of an exemplary modulo-6 up-counter employed in FIG. 9.
Figure 13:
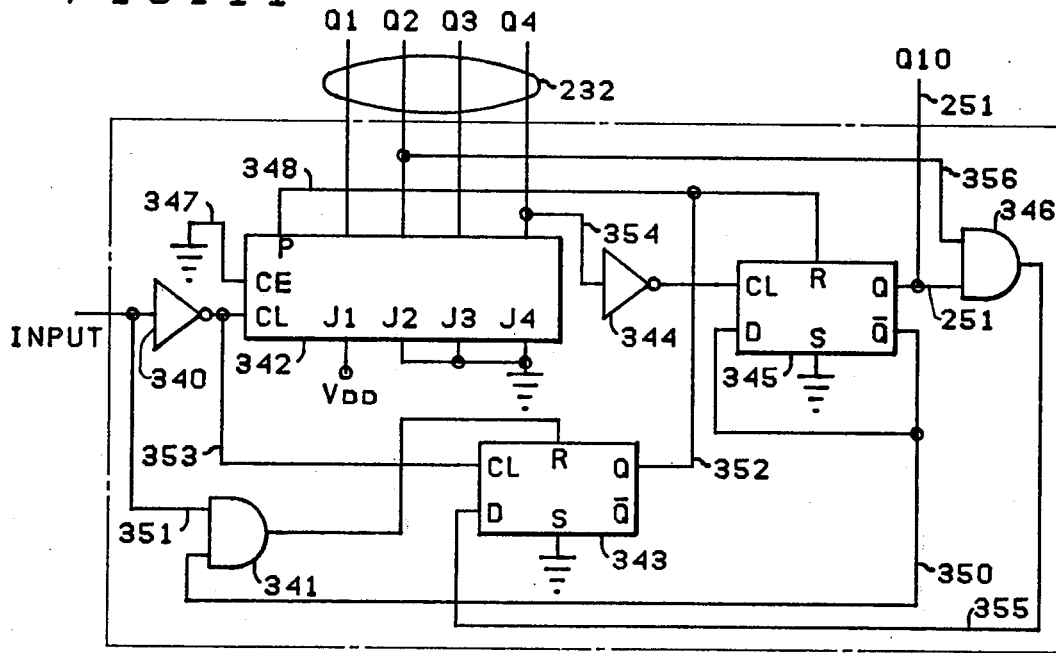
FIG. 13 is a schematic diagram of a modulo-12 up-counter employed in FIG. 9.

Crystal oscillator 1 functions as the time base reference for the clock as well as the racing timer. The output of oscillator 1 is shown connected to the input of binary counter 220 as well as to binary counter 2. Counter 220 may be a 14-stage binary counter identical to counter 2. The reset input of counter 220 would be connected to logic ZERO because this counter is never reset. The output signal 254 from counter 220 has a pulse repetition rate of 1 Hz. Signal 254 is applied to decade counter 221. This counter can be embodied using an up-counter such as the RCA CD4518B integrated circuit using the enable terminal as the input with the clock input held at logic ZERO. The Q4 output of counter 221 is applied to the input of modulo-6 up-counter 222. A suitable modulo-6 up-counter is illustrated in FIG. 11. The Q3 output 255 of counter 222 has a pulse frequency of 1 pulse per minute. Signal 255 is applied to minutes setting circuit 224, which is detailed in FIG. 12. With switch 223 in the run position, signal 255 is passed unchanged to the input of decade counter 225 which may be embodied using a CD4518B integrated circuit using the enable terminal as the input with the clock input held at logic ZERO. The Q4 output signal from counter 225 is connected to modulo-6 up-counter 226 which may be embodied as illustrated in FIG. 11. The Q3 output 256 of counter 226 is applied to hours setting circuit 228 which may be the same type as circuit 224. Signal 256 has a pulse repetition rate of one pulse per hour. With switch 227 set in the run position, signal 256 is passed unchanged to the input of modulo-12 counter 229. A suitable modulo-12 counter is illustrated in FIG. 13.

Output 230 from decade up-counter 225 consists of the Q1, Q2, Q3 and Q4 binary coded-decimal signals representing the $2^0$, $2^1$, $2^2$ and $2^3$ bits respectively of the minutes digit. When switch 223 is enabled by a ONE signal on conductor 92, the Q1, Q2, Q3 and Q4 signals 230 are applied to conductors 239, 240, 241 and 242 respectively. These conductors apply these signals to the $2^0$, $2^1$, $2^2$ and $2^3$ inputs of display driver 6 which energizes digit 401 of digital display 9 to display the units-minutes digit of the clock time. Output 231 from modulo-6 up-counter 226 consists of the Q1, Q2, and Q3 binary-coded decimal signals representing the $2^0$, $2^1$ and $2^2$ bits respectively of the tens-minutes digit. When switch 234 is enabled by a ONE signal on conductor 92, the Q1, Q2 and Q3 signals 231 are applied to conductors 243, 244 and 245 respectively. These conductors apply these signals to the $2^0$, $2^1$ and $2^2$ inputs of display driver 7 which energizes digit 402 of digital display 9 to display the tens-minutes clock information. Grounded conductor 246 supplies a logic ZERO signal to the $2^3$ input of display driver 7. Similarly output 232 consists of the Q1, Q2, Q3 and Q4 outputs of modulo-12 up-counter 229. When switch 235 is enabled by a ONE signal on conductor 92, the Q1, Q2, Q3 and Q4 signals 232 are applied to conductors 247, 248, 249 and 250 respectively. These conductors apply these signals to the $2^0$, $2^1$, $2^2$ and $2^3$ inputs of display driver 8 which energizes digit 403 of digital display 9 to display the units-hours clock information. Signal 251 is obtained from the Q10 output of modulo-12 counter 229 and represents the tens-minutes digit information. If a ONE signal is present on conductor 92 and if signal 251 is a ONE, then the output 96 of AND gate 95 is a ONE. This signal is applied to the input of display driver 252. Display driver 252 energizes digit 404 of display 9 to display a decimal 1 where signal 96 is a ONE. If either signal 251 or signal 92 is ZERO the tens-minutes digit is not energized. The position of the digits of display 9 is illustrated in FIG. 10. Display drivers 6, 7 and 8 may be embodied using the CD4055AE integrated circuit as discussed relative to FIG. 1. A display frequency signal 22 having a suitable frequency such as 32 Hz is supplied to display drivers 6, 7, 8 and 252. This signal may be derived from the Q9 output terminal of the CD4020AE integrated circuit used for binary counter 220. Signal 22 is derived from counter 220 because this counter counts continuously and is never reset. Signals 33, 43 and 53 consist of the seven segment electrode drive signals and common electrode display output signal as described relative to FIG. 1. Display driver 252 need only drive a single units numeral and can be embodied using an exclusive-OR gate such as the CD4030AE. Signals 22 and 96 act as inputs to the exclusive-OR gate. When the signal 96 is a ZERO the output of the gate applied to the display segment is the same as display frequency signal 22. This signal has the same phase as the signal applied to the common electrode of display 9 and therefore digit 404 is not energized. When signal 96 is a ONE the exclusive-OR gate inverts display frequency signal 22. This results in a voltage being applied between the display segment and the common electrode which energizes the numeral.

Switch 233 contains four separate poles which may be realized using SW A, SW B, SW C and SW D of the CA4016AE integrated circuit. Switches 234 and 235 may be realized in the same manner. Conductor 92 is connected to the control terminals of all the individual integrated circuit switch units. When the mode switch 91 is in the clock position it applies a logic ZERO to the input of inverter 97. The output of inverter 97 provides a ONE signal on conductor 92. When the signal on conductor 92 is a ONE all the switch units assume a low impedance between their output and input terminals. This causes the time-of-day clock information from counters 225, 226 and 229 to be displayed on digital display 9. The ONE signal on conductor 92 is inverted by invertor 90 to provide a ZERO signal on conductor 93 which is connected to the control inputs of switches 236, 237 and 238. Switches 236, 237 and 238 may be of the same type as switches 233, 234 and 235. A ZERO signal applied to their control inputs causes them to act essentially as an open circuit.

When mode switch 91 is in the timer mode it applies a logic ONE signal to inverter 97. The output of inverter 97 applies a ZERO signal on conductor 92 which is inverted by inverter 90 to apply a ONE signal on conductor 93. The ZERO signal 92 causes switches 233, 234 and 235 to act as open circuits thereby effectively disconnecting conductors 239 through 250 from counters 225, 226 and 229. The ONE signal on conductor 93 causes switches 236, 237 and 238 to assume a low impedance. This connects the Q1, Q2, Q3 and Q4 outputs of counter 3 to conductors 239, 240, 241 and 242 respectively, connects the Q1, Q2 and Q3 outputs of counter 4 to conductors 243, 244 and 245 respectively, and connects the Q1, Q2, Q3 and Q4 outputs of counter 5 to conductors 247, 248, 249 and 250 respectively. The signals on these conductors control the display drivers 6, 7 and 8 as described relative to FIG. 1 to provide the same racing timer information as described relative to FIG. 1.

When mode switch 91 is in the TIMER position it applies the $V_{DD}$ voltage from battery 180 and on-off switch 181 to input 19 of reset circuit 11. Reset circuit 11 functions as described relative to FIGS. 1 and 6. That is, it resets the racing timer when reset button 16 is depressed or when input 19 is first energized. A ZERO signal is applied to input 19 when mode switch 91 is in the clock position. This ZERO signal is applied through resistor 183 of reset circuit 11 to the input of inverter 185. This produces a ONE output from inverter 185 which causes the output 18 from OR circuit 189 to be a ONE. This ONE signal holds counters 2, 3, 4 and 5 in the reset state and disables the audio amplifier when the system is in the clock mode. It should be noted that switch 181 may be replaced with a conductor if continuous energizing of the system is preferred. Reset circuit 11 will function properly in this case but can be simplified if desired.

The 1 Hz pulse signal 254 from binary counter 220 is applied to minutes setting circuit 224 and hours setting circuit 228. When switch 223 is in the set minutes position the minutes count is advanced at a one digit per second rate. Similarly when switch 227 is in the set hours position the hours count is advanced at a one digit per second rate. These switches are useful for setting the clock to the correct time of day. A suitable setting circuit for circuits 224 and 228 is illustrated in FIG. 12 and described below relative to circuit 224.

Figure 15:
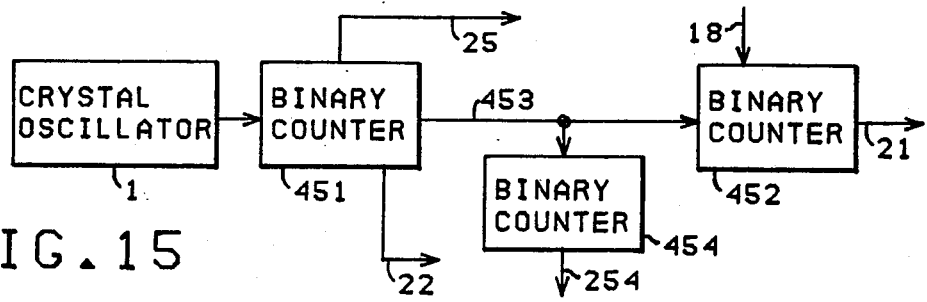
FIG. 15 is a block diagram of an alternate embodiment of a portion of the system of FIG. 9.

The timer/clock circuit of FIG. 9 shares the most expensive elements; the crystal oscillator, the display drivers and the digital display. The clock counters 220, 221, 222, 225, 226 and 229 function and keep accurate time even when the system is being used as a yacht timer. The use of separate binary counters 2 and 220 prevents the loss of timing counts for binary counter 220 when binary counter 2 is reset. A less expensive but less accurate embodiment would share binary counter 2 for both the timing and clock functions. In that case resetting all or a portion of the shared binary counter stages would result in the loss of some timing counts of the clock. This loss would amount to a fraction of a second each time the counter is reset. A more desirable economical solution illustrated in FIG. 15 involves an additional binary counter 451 that is not reset. The input to counter 451 is connected to the output of crystal oscillator 1 and therefore counter 451 and oscillator 1 would function together as a time-base reference. The output 453 of counter 451 drives two separate counters 452 and 454. Counter 452 is reset by signal 18 while counter 454 is never reset. For example, if a 10 stage binary counter 451 is used with a 16384 Hz oscillator, the output frequency of signal 453 from counter 451 would be 16 Hz. Counters 452 and 454 would require only 4 binary stages each to divide the 16 Hz input to obtain 1 Hz outputs. When counter 452 is reset at a racing signal it would begin measuring the time interval to within 1/16 second. This may represent a reasonable compromise between accuracy and economy and would be especially useful if the entire counter/timer logic was embodied in a single large-scale-integrated circuit. Since counters 451 and 454 are never reset they may be embodied by a single 14 stage binary counter such as the CD4020AE integrated circuit. Signal 453 is available as an output, for example Q10, of this integrated circuit. The display frequency signal 22 may be obtained from the Q9 output of this integrated circuit.

While the embodiment of FIG. 9 is illustrated using switches to connect the display driving means to either outputs 32, 42 and 52 or to outputs 230, 231, 232 and 251, it is obvious that additional display drivers and additional digital display numerals on digital display 9 may be used to simultaneously display information related to the outputs 32, 42 and 52 representing the yacht race timing information and information related to the outputs 230, 231, 232 and 251 representing the time-of-day.

Referring now to FIG. 11, a modulo-6 up-counter is illustrated. Input 300 is inverted by inverter 301 and drives the clock input of a D-type flip-flop 302 which may be embodied using a CD4013AE integrated circuit. The set and reset inputs of all D flip-flops of FIG. 11 are connected to logic ZERO. Each negative input transition of input 300 causes flip-flop 302 to change state since the $\overline{Q}$ output signal 309 is connected to the D input of flip-flop 302. The output of NOR gate 305 is connected to the D input of flip-flop 303. When the Q3 output signal 312 is a ZERO, NOR gate 305 inverts Q2 output signal 310. Therefore, flip-flop 303 will change state on positive clock transitions of signal 309 when signal 312 is a ZERO. When signal 312 is a ONE the output of gate 305 is a ZERO and therefore flip-flop 303 cannot change state to a ONE. This keeps Q2 in the ZERO state during the transition from decimal count 5 to decimal count 0. The $\overline{Q}$ output signal 313 is connected to the D input of flip-flop 304. Flip-flop 304 changes state on each positive clock input transition as determined by the output of NOR gate 307. NOR gate 307 inverts the Q2 output 310 whenever either or both signals 308 and 312 are ZERO. When both signals 308 and 312 are ONE which occurs only for the decimal count 5, the ONE output from AND gate 306 causes the output of gate 307 to become a ZERO. When the next negative transition of input 300 occurs output 308 of flip-flop 302 changes state to a ZERO. This causes the output of AND gate 306 to become ZERO which causes the output of NOR gate 307 to become a ONE which in turn causes output 312 of flip-flop 304 to change state from ONE to ZERO. Since output 310 remains ZERO during this transition as described above, the decimal count 0 follows the decimal count 5 and the desired counting sequence 0, 1, 2, 3, 4, 5, 0, 1, 2, 3, 4, 5, 0, etc., is obtained.

Referring now to FIG. 12, a setting circuit is illustrated. With switch 223 in the run position, a ONE signal is applied to input 328 of NOR 320 of flip-flop 320-321. Since resistor 325 holds input 327 to NOR 321 at a ZERO, the ONE signal 328 causes the flip-flop to assume a state with signal 330 being a ZERO and signal 331 being a ONE. Signal 331 enables AND gate 323 and signal 333 assumes the same signal state as input 255. Since signal 330 produces a ZERO output 332 from AND gate 322, the output 334 of OR gate 324 assumes the same state as signals 333. Therefore input signal 255 is passed unchanged to the output of setting circuit 224. With switch 223 in the SET position the output state of flip-flop 320-321 is reversed. Signal 330 becomes a ONE and enables setting pulse input signal 254 to be passed by AND gate 322 to the input 332 of OR gate 334. The ZERO signal 331 results in a ZERO signal 333 and therefore the output 334 of OR gate 324 assumes the same state as signal 332. Therefore setting pulse signal 254 is passed unchanged to the output 334 of the setting circuit 224.

Referring now to FIG. 13, a suitable modulo-12 up-counter is illustrated. A decade up-counter having jam inputs such as the CD4029AE integrated circuit is suitable for decade up-counter 342. The binary/decade input is connected to ground, while the up/down input is connected to $V_{DD}$. Clock enable 347 and the jam inputs J2, J3 and J4 which correspond to $2^1$, $2^2$ and $2^3$ are connected to ground while the J1 jam input which corresponds to $2^0$ is connected to $V_{DD}$. Therefore applying a logic ONE to preset input 348 sets the counter 342 to decimal count 1. The Q1, Q2, Q3 and Q4 outputs from counter 342 form the units-minutes signals 232. The Q10 output of D-type flip-flop 345 forms the tens-minutes signal 251. Consider the counting action starting with the Q1, Q2, Q3, Q4 and Q10 signals in the ZERO state. With input signal 351 in the ONE state and since the Q10 signal 350 is also in the ONE state, the output of AND gate 341 is a ONE which resets D-type flip-flop 343 and causes its Q output signal 32 to be a ZERO. The next negative transition of input signal 351 is inverted by inverter 340. This produces a positive transition on signal 353 which is applied to the clock input of counter 342. This positive transition causes the count to advance to decimal 1. Additional negative-transitions of signal 351 similarly cause counter 342 to advance to decimal counts 2, 3, 4, 5, 6, 7, 8 and 9. On the next negative transition of signal 351 decade counter 342 changes to a decimal 0 count and therefore Q4 output signal 354 changes from a ONE to a ZERO. This signal is inverted by inverter 344 and its output is applied to the clock input of flip-flop 345. The positive output transition of inverter 344 causes flip-flop 345 to change state and Q10 output 251 becomes a ONE. This corresponds to decimal count 10. The $\overline{Q}$ output 350 is now a ZERO. This signal is applied to AND gate 341 and blocks further reset pulses to D flip-flop 343. Flip-flop 343 remains in the reset state because signal 355 applied to its D input remains a ZERO. The next two negative transitions of signal 351 cause decade counter to counter to 1 then 2 while Q10 remains a ONE. These counts represent the decimal counts 11 and 12. When decimal counter 12 is reached, input signals 251 and 356 to AND gate 346 have ONE values. The output 355 of gate 346, which was ZERO for the first 11 counts, now assumes a ONE value. This signal is applied to the D input of flip-flop 343. The next negative transition of input signal 351 is inverted by inverter 340 and provides a positive transition signal 353 to the clock input of flip-flop 343. This causes output 352 to become a ONE. Output signal 352 resets flip-flop 345 so that output 251 becomes a ZERO. Signal 352 is also applied to the preset input of counter 342. This causes the counter to assume a decimal 1 state. Signal 350 becomes a ONE and when signal 351 returns to a ONE the output of AND gate 341 becomes a ONE and resets flip-flop 342. This completes the cycle. The counter will continue to count 1, 2, 3, 4, 5, 6, 7, 8, 9, 10, 11, 12, 1, 2, etc., as required.

The binary-coded-decimal outputs of decade counter 221 and modulo-6 counter 222 can be connected through additional switch units similar to 233 and 234 to additional display drivers if a clock display including units-seconds and tens-seconds readouts is also desired. Furthermore, while a 12-hour time-of-day clock function is described relative to FIG. 9, a 24-hour time-ofday function may be used without departing from the spirit of this invention.

A housing similar to that of FIG. 2 is suitable for the combined timer/clock. Switches 91, 223 and 227 for selecting the timer mode or clock mode, setting minutes and setting hours respectively would be added and could be mounted within the housing and operated from the front of the housing similar to switches 181 and 61 of FIG. 2.

While the above preferred embodiments have been described using COS/MOS logic devices, it is obvious to those skilled in the art that other digital logic families may be used. It is obvious to those skilled in the art that the entire logic and even the audio amplified can be combined on a single large-scale integrated silicon chip. The entire circuit may be packaged in a wristwatch rather than in a clock-type enclosure. A suitable wristwatch-type enclosure 414 with wristband 415, switches 61, 91, 223 and 227, and reset button 16 is illustrated in FIG. 14. The audio beep function may be embodied by an electronically controlled mechanical alarm as well as by an electroacoustical transducer. Alternately, a vibratory transducer may be driven by amplifier 14 to produce a vibratory output to the wrist of the user.

While the preferred embodiment has discussed liquid crystal displays, other digital displays such as electrophoretic would also be suitable. Other detailed changes in logic and switching arrangements may be made without deviation from the spirit and scope of this invention. Other timing references such as a tuning fork oscillator may also be used without departing from the spirit of this invention.

I claim as my invention:

1. A digital timing system for providing yacht race timing information to an individual comprising:
   time-base reference means for producing timing pulses; electronic counting means including:
   a. a chain of recyclable downcounter means connected to said time-base reference means and responsive to said timing pulses for providing output signals indicative of a decreasing count value,
   b. automatic recylcing means coupled to said downcounter means and responsive to a reference count value to set said downcounter means to a preselected count value from which said timing pulses cause said downcounter means to count down to said reference count value;
   actuator means connected to said electronic counting means for setting said downcounter means to an initial count value;
   digital display means connected to said electronic counting means being operable to provide a visual display corresponding to said decreasing count value; and
   output means connected to said electronic counting means for producing output signals in response to a predetermined sequence of count values.

2. The digital timing system of claim 1 wherein the time required to count down from said preselected count value to said reference count value defines a time period which corresponds to the interval between yacht racing signals or an integer multiple of said interval.

3. The digital timing system of claim 1 wherein said output means includes a vibratory means.

4. The digital timing system of claim 1 wherein the output signals produced by said output means are signals occurring at a predetermined intermittent rate corresponding to the decreasing count value rate.

5. The digital timing system of claim 4 wherein the said predetermined intermittent rate is a one-second rate.

6. The digital timing system of claim 1 wherein the said output means includes a sound transducer, said output signal being an audio signal.

7. The digital timing system of claim 1 wherein the said predetermined sequence of count values corresponds to successive count values occurring between a predetermined count value less than said preselected count value and said reference count value.

8. The digital timing system of claim 1 wherein the said reference count value is a zero count value.

9. A digital timing system for providing yacht race timing information to an individual comprising:
   time-base reference means for producing timing pulses;
   electronic counting means including:
   a. a chain of recyclable downcounter means connected to said time-base reference means and responsive to said timing pulses for providing output signals indicative of a decreasing count value,
   b. automatic recycling means coupled to said downcounter means and responsive to a reference count value to set said downcounter means to one of several selectable preselected count values from which said timing pulses cause said downcounter means to count down to said reference count value;
   selector means connected to said electronic counting means for selecting one of said several preselected count values; and
   digital display means connected to said electronic counting means being operable to provide a visual display corresponding to said decreasing count value.

10. The digital timing system of claim 9 wherein said reference count value is a zero count value and said selectable preselected count values includes 4 minutes 59 seconds and 2 minutes 59 seconds.

11. A digital timing system for displaying the time-of-day as well as providing yacht race timing information to an individual, comprising a wristwatch housing including:
    time-base reference means for producing timing pulses;
    first electronic counting means including:
    a. a chain of recyclable counter means connected to said time-base reference means and responsive to said timing pulses for providing output signals indicative of a decreasing count value,
    b. automatic recycling means coupled to said recyclable counter means and responsive to a reference count value to set said recyclable counter means to a preselected count value from which said timing pulses cause said recyclable counter means to count to said reference count value;
    actuator means connected to said first counting means for setting said counter means to an initial count value;
    second electronic counting means connected to said time-base reference means, operatively independent of said actuator means and responsive to said timing pulses for providing output signals indicative of an increasing count value representing the time-of-day;

setting means connected to said second counting means for setting the count of said second counting means to a desired value;

a display driving means;

selector means for connecting said display driving means either to the output of said first counting means or to the output of said second counting means; and numerical display means connected to said display driving means to provide a digital display of the output of said first or second counting means, said output of said first counting means representing information in minutes and seconds related to said decreasing count value and said output of said second counting means representing the time-of-day.

12. The digital timing system of claim 11 wherein said time-base reference means consists of a crystal oscillator and a third electronic counting means connected to the output of said oscillator, said third counting means operatively independent of said actuator means and responsive to the output of said oscillator for providing timing pulses.

* * * * *